United States Patent [19]
Yeo

[11] Patent Number: 5,917,773
[45] Date of Patent: Jun. 29, 1999

[54] APPARATUS AND METHOD FOR WRITING TO MULTIPLE ADDRESSES

[75] Inventor: Cheow F. Yeo, San Jose, Calif.

[73] Assignee: Advanced Array Corporation, San Jose, Calif.

[21] Appl. No.: 09/007,257

[22] Filed: Jan. 14, 1998

[51] Int. Cl.$^6$ .................................................. G11C 8/00
[52] U.S. Cl. ................ 365/230.06; 365/149; 365/230.01
[58] Field of Search ............................... 365/230.06, 149, 365/189.01, 230.01

[56] References Cited

U.S. PATENT DOCUMENTS 5,654,932  8/1997  Rao ................................. 365/230.06 X
5,774,135  6/1998  Letham ........................... 365/230.06 X

*Primary Examiner*—Huan Hoang
*Attorney, Agent, or Firm*—William L. Paradice, III

[57] ABSTRACT

A memory array includes a plurality of columns, each of said columns including a predetermined number of memory cells. A write driver for generating a signal which facilitates the writing of data to one or more of said memory cells is provided and has coupled to an output terminal thereof a write data line. The write data line, along which signals generated by the write driver propagate to selected memory cells, includes a plurality of column nodes. The columns are divided into groups, where each group contains columns bearing consecutive column addresses. One-half the columns in a first group, which bear the first column addresses, are associated with those column nodes closest to the write driver, while the other half of the columns in the first group, which bear the next consecutive column addresses, are associated with the column nodes furthest from the write driver. One-half the columns in a second group, which bear the next consecutive column addresses, are associated with the next available column nodes closest to the write driver, while the other half of the columns in the second group, which bear the next consecutive column addresses, are associated with the next available column nodes furthest from the write driver.

3 Claims, 3 Drawing Sheets

5,917,773

APPARATUS AND METHOD FOR WRITING TO MULTIPLE ADDRESSES

BACKGROUND

1. Field of Invention

This invention relates generally to semiconductor memories and specifically to a method of addressing multiple locations of a memory device.

2. Description of Related Art

In some applications such as, for instance, video graphics, it is desirable to write the same data, e.g., pixel information, to a plurality of bits of an associated memory device. In such applications, data is typically written simultaneously to memory cells within more than one column of the memory device. As explained below, the simultaneous writing of data to memory cells within multiple columns of a memory device typically requires a large driver circuit.

FIG. 1 shows a portion 10 of a conventional DRAM array having two columns C0 and C1, where each column C includes two associated memory cells 12. Each memory cell 12 includes a pass transistor T and a storage capacitor C. For instance, memory cell 12a, which lies in the first row of column C0, includes a pass transistor Ta and a storage capacitor Ca. The binary state of a cell 12 is determined in a well known manner by sensing the differential voltage across the complementary bit lines BL and $\overline{BL}$ associated with that cell 12. For instance, to read cell 12a, an appropriate read voltage is applied to word line WL0 and to isolation node ISO, thereby turning on pass transistor Ta and isolation transistors 14, respectively. The un-selected word lines (e.g., WL1) are held at a low voltage such as, for instance, ground potential, so that the pass transistors Tb and Tc of memory cells 12b and 12c, respectively, are non-conductive. If the storage capacitor Ca of memory cell 12a is charged, thereby indicating that memory cell 12a is in a programmed state, i.e., representing a binary "1", latch 16a assumes a first binary state in which the voltage on bit line BL0 is higher than the voltage on the bit line $\overline{BL0}$. If, on the other hand, the storage capacitor Ca is not charged, thereby indicating that memory cell 12a is in an erased state, i.e., representing a binary "0", latch 16a assumes a second binary state in which the voltage on bit line $\overline{BL0}$ is higher than the voltage on bit line BL0. A column address strobe ($\overline{CAS}$) signal (not shown for simplicity) is pulsed on the column node C0 to allow the differential voltage across complementary bit lines BL0 and $\overline{BL0}$ to appear across lines complementary lines WD and $\overline{WD}$ via pass transistors 18a. This differential voltage is provided to the sense amplifier 20 which, in response thereto, ascertains the binary data stored in the cell 12a.

When writing to one of the memory cells 12, externally generated data is provided to a conventional input logic circuit 21 which, in response thereto, provides appropriate signals to the write data drivers 22. For instance, to write a binary "1" to cell 12a, the word line WL0, isolation node ISO, and column node C0 are driven to a high voltage so as to turn on transistors Ta, 14, and 18a, respectively. Driver 22a drives the write data line WD to a voltage greater than the threshold voltage $V_T$ of the latch 16a, while driver 22b pulls the complementary write data line $\overline{WD}$ to a voltage lower than the $V_T$ of the latch 16a. As a result, the latch 16a transitions to the first binary state where, as discussed earlier, the bit line BL0 is at a higher voltage than is the complementary bit line $\overline{BL0}$. The higher voltage on the bit line BL0 charges the capacitor Ca of cell 12a, thereby writing a "1" to the cell 12a.

Conversely, a binary "0" is written to cell 12a by pulling the bit line BL0 to a low voltage (below the $V_T$ of the latch 16a) while driving the complementary bit line $\overline{BL0}$ to a high voltage (above the $V_T$ of the latch 16a). Here, the latch 16a is driven to the second binary state to ensure that charge does not accumulate on the capacitor Ca of cell 12a.

Due to the inherent resistance of the write data lines WD and $\overline{WD}$, the attenuation of signals provided by the drivers 22a and 22b increases as the signals propagate along on the lines WD and $\overline{WD}$, respectively. Thus, signal attenuation is greater when writing data to memory cells further away from the write drivers 22, i.e., signal attenuation is greater when writing data to memory cell 12d than when writing data to memory cell 12a. Accordingly, increasing the number of columns in a memory array requires a corresponding increase in the size of the associated drivers 22.

When simultaneously writing data to the memory cells 12 of more than one column, a much larger signal current is required which, in turn, requires a corresponding increase in the drive capability and thus size of the drivers 22. FIG. 2 shows a DRAM array 30 having 256 columns C of the type shown in FIG. 1, where each of the columns of the array 30 contains N of the memory cells 12. Data is written to and read from the cells 12 of the array 30 in a conventional manner, as described above with respect to the array portion 10 shown in FIG. 1. Each of the columns C is coupled to an associated column node N0–N255 and is assigned a column address 0–255, as shown in FIG. 2. The write data line WD is driven by a conventional write driver 34 in response to data received by an input logic circuit 32. The complementary write data line $\overline{WD}$ and its associated driver are not shown in FIG. 2 for simplicity.

To simultaneously write data to the memory cells within more than one of the columns C of the array 30, the columns containing the memory cells desired to be written to are first selected in a conventional manner by an associated decode circuit (not shown for simplicity). Once the desired columns are selected for writing, externally generated data is provided in a well known manner to the logic circuit 32 which, in turn, provides appropriate control signals to the write driver 34 in a well known manner. In response thereto, the write driver 34 drives the latches 16 (not shown in FIG. 2) within each of the selected columns to either the first or second binary state, as determined by the data received via the logic circuit 32. To properly program the selected cells, the write driver 34 must drive each of those nodes N0-255 associated with the selected columns to a voltage which exceeds the threshold $V_T$ of the latches therein.

As mentioned earlier, the signals generated by the driver 34 attenuate as they propagate along the write data line WD. The voltage drop $V_n$ along line WD between the write driver 34 and the column at node Nn may be expressed as $V_n = IR_n$, where n is an integer between 0 and 255 inclusive, I is the current necessary to drive one of the latches 16, and $R_n$ is the resistance of the write data line WD between the output terminal of driver 34 and node Nn. For instance, assuming the resistance of the write data line WD between adjacent columns is equal, and may thus be expressed as $R_c$, the resistance of the write data line WD between the driver 34 and the column at node N0 is equal to $R_c$, the resistance of the write data line WD between the driver 34 and the column at node N1 is equal to $2R_c$, and so on, such that the resistance of the write data line WD between the driver 34 and the column at node N255 is equal to $256R_c$.

For instance, where it is desired to simultaneously write data to the memory cells in eight consecutively addressed columns, the write driver 34 should provide a signal current of 8I onto the write data line WD. The attenuation of this signal is equal to approximately $8IR_{ave}$, where $R_{ave}$ is the average resistance of the write data line WD between the driver 34 and each of the selected columns. Thus, the signal attenuation associated with simultaneously writing data to the memory cells within the eight consecutively addressed columns closest to the write driver 34, i.e., the columns corresponding to the column nodes N0–N7, is given by:

$$8IR_{ave} = 8I(R_0 + R_1 + R_2 + R_3 + R_4 + R_5 + R_6 + R_7)/8 =$$

$$\sum_{n=0}^{7} IR_n = \sum_{c=1}^{8} IR_c = 36IR_c.$$

The signal attenuation associated with simultaneously writing data to the memory cells 12 within the eight consecutively addressed column furthest from the write driver 34, i.e., the columns corresponding to the column nodes N248–N255, is given by:

$$8IR_{ave} = (R_{248} + R_{249} + R_{250} + R_{251} + R_{252} + R_{253} + R_{254} + R_{255})/8 =$$

$$\sum_{n=248}^{255} IR_n = \sum_{c=249}^{256} IR_c = 2020IR_c.$$

Accordingly, since the maximum signal attenuation associated with simultaneously writing data to the memory cells within eight columns of the array 30 is equal to approximately $2020IR_c$, the write driver 34 must provide sufficient signal current on the write data line WD to compensate for an attenuation loss of approximately $2020IR_c$. Otherwise, the attenuation of signals generated by the write driver 34 and provided on the write data line WD may not be sufficient to properly program the memory cells within one or more of the selected columns. It is therefore desirable to reduce the maximum signal attenuation required when simultaneously writing data to memory cells within multiple columns so that the drive-capability and thus the size of the write driver 34 may be reduced.

SUMMARY

In accordance with the present invention, a memory array is disclosed in which the addresses of the columns within the array are distributed in a novel manner so as to reduce the maximum signal attenuation experienced along a write data line when simultaneously writing data to memory cells within more than one of the columns of the array. In accordance with the present invention, the memory array includes a plurality of columns, each of which includes a predetermined number of memory cells and is coupled to a write data line at an associated column node. A data write driver provides control signals to the write data line to facilitate programming of the memory cells of the columns of the array. The columns of the array are divided into groups, where each group contains a predetermined number columns bearing consecutive addresses. In one embodiment, one-half the columns in a first group, which bear first consecutive column addresses, are associated with those column nodes closest to the write driver, while the other half of the columns in the first group, which bear the next consecutive column addresses, are associated with the column nodes furthest from the write driver. In a similar manner, one-half the columns in a second group, which bear the next consecutive column addresses, are associated with the next available column nodes closest to the write data driver, while the other half of the columns in the second group, which bear the next consecutive column addresses, are associated with the next available column nodes furthest from the write driver.

In this manner, when simultaneously writing data to memory cells within the columns of a selected group the attenuation of signals propagating along the write data line is substantially constant, irrespective of which group of columns is selected for writing. Accordingly, as explained in detail below, the present column addressing technique results in a substantial reduction in the maximum signal attenuation associated with simultaneously writing data to the memory cells in multiple columns of the array, thereby allowing for a corresponding reduction in the size of the write driver and, in addition, reducing power dissipation during such writing operations.

Like components in the Figures are similarly labeled.

DETAILED DESCRIPTION

The present invention is described below with reference to a DRAM array 40 for simplicity only and is not to be construed as limited to the specific examples provided herein. Indeed, it is to be understood that the principles of the present invention as described below and defined in the appended claims may, in other embodiments, be applied so as to achieve different addressing configurations and, further, may be employed in other types of memory arrays such as, for instance, SAM, SRAM, EPROM, EEPROM, and Flash memory arrays, as well as other programmable devices such as, for instance, PLAs and ISPLDs. Further, memory arrays in accordance with other embodiments of the present invention may include a greater or fewer number of columns, and may also include other suitable types of memory cells.

Figure 1:
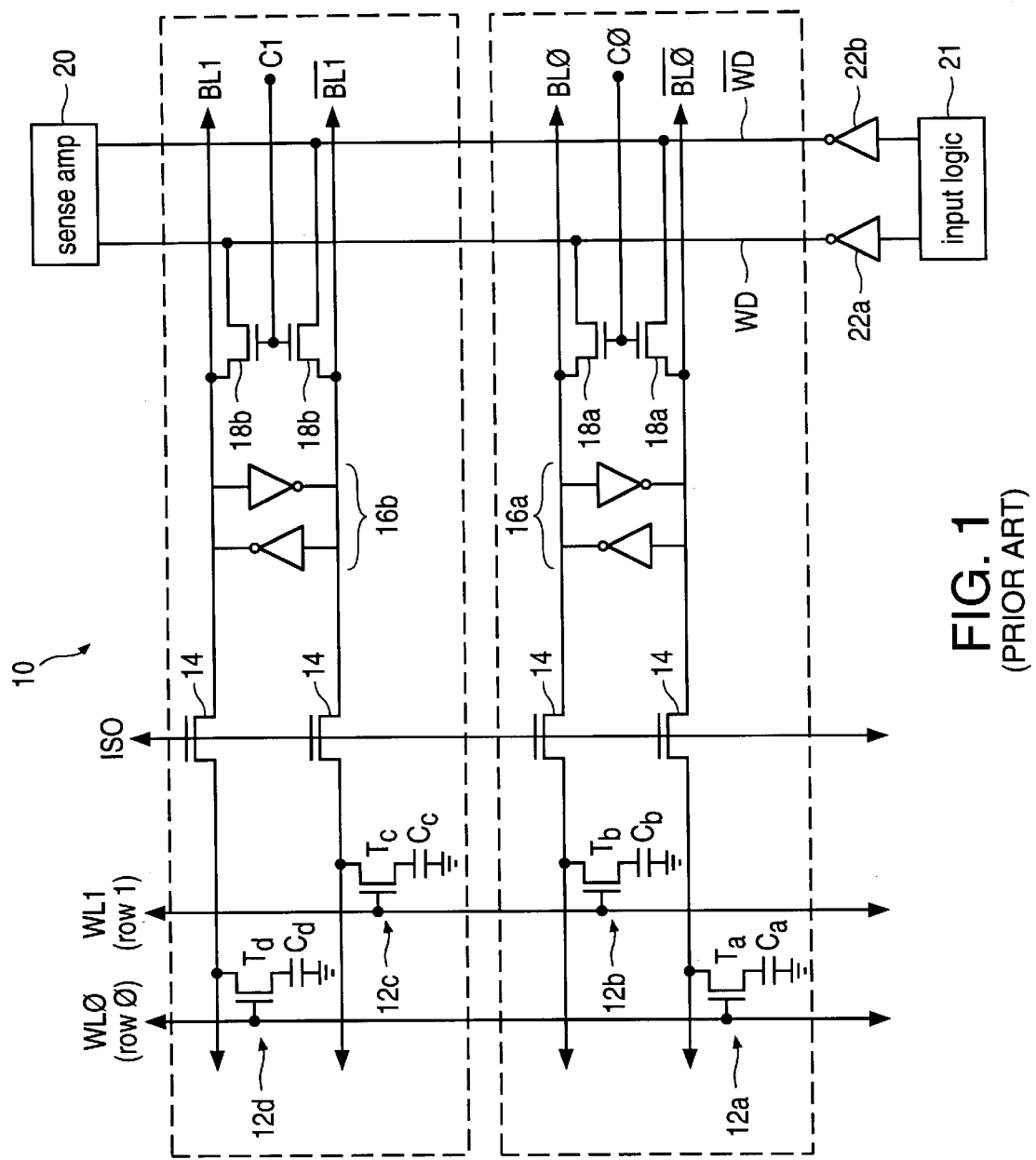
FIG. 1 is a schematic diagram of a portion of a conventional DRAM illustrating the columns thereof.
Figure 3:
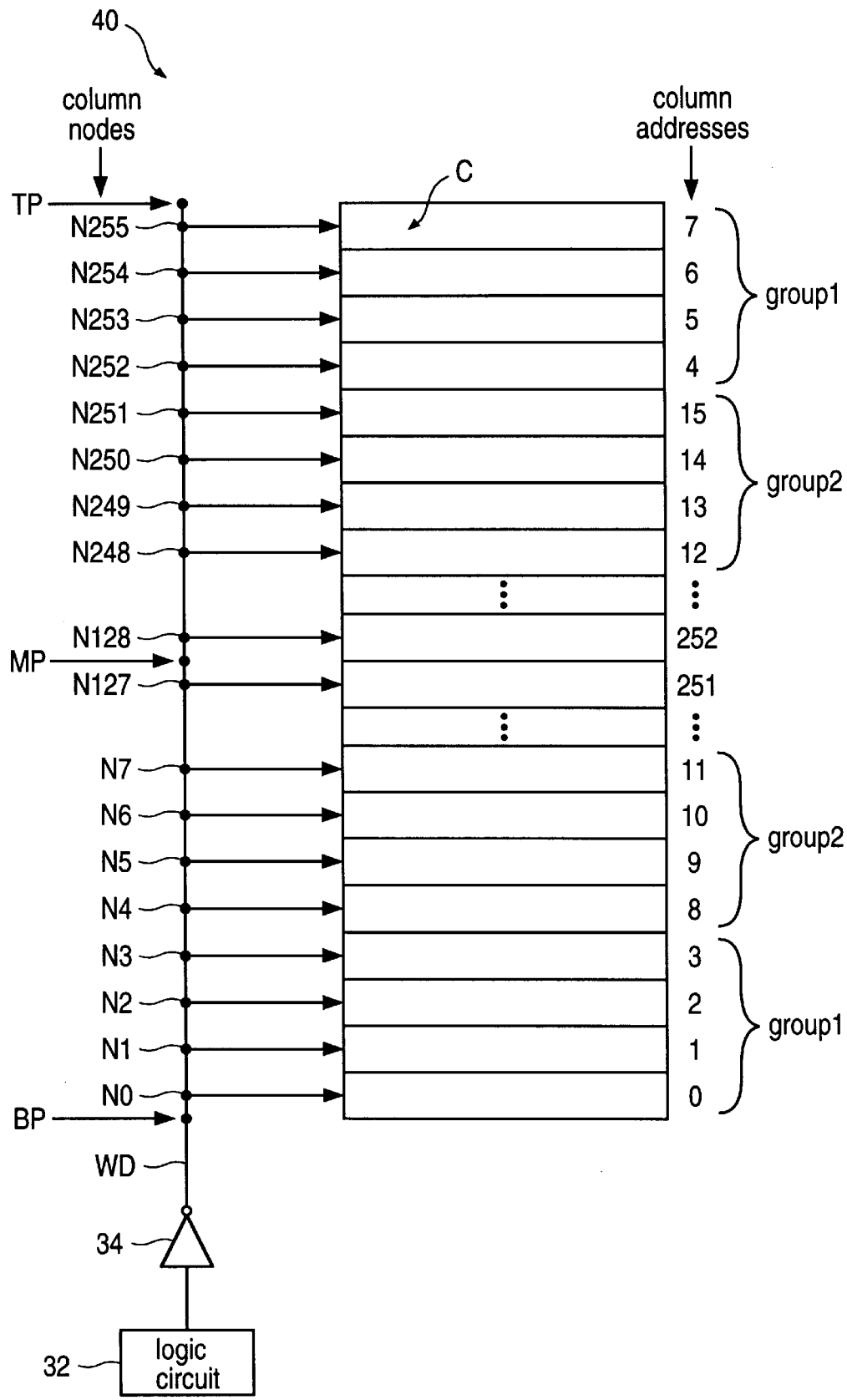
FIG. 3 is a block diagram of a DRAM array employing a column addressing scheme in accordance with one embodiment of the present invention.

Referring now to FIG. 3, the array 40 is shown to include 256 columns C, where each of the columns C of the array 40 is of the type illustrated in FIG. 1. Thus, each of the columns C of the array 40 includes N of the memory cells 12 and latches 16, where data is written to and read from the cells 12, as described above with respect to FIG. 1, by driving the latches 16 within columns selected for reading to either the first or second binary state, depending upon the specific data received via the logic circuit 32.

The columns C of the array 40 are addressed in a novel manner, as described below with reference to FIG. 3. The 256 columns C of the array 40 are divided into thirty-two groups of eight consecutively-addressed columns, where the first four consecutively addressed columns of a particular group are assigned to column nodes lying between a bottom point BP of the array 40 and a midpoint MP of the array 40, and the second four consecutively addressed columns of that group are assigned to column nodes lying between the midpoint MP and a top point TP of the array 40, as indicated in FIG. 3. Thus, the first four columns and the second four columns of the first group are assigned to the four column nodes closest to the write driver 34 (N0–N3) and to the column nodes furthest from the write driver 34 (N252–N255), respectively, while the first four columns and the second four columns of the second group are assigned to the next available column nodes closest to the driver 34 (N4–N7) and to the next available column nodes furthest from the driver 34 (N248–N251), respectively, and so on. For instance, the first group includes those columns bearing column addresses 0–7, where the columns bearing column addresses 0–3 and 4–7 are coupled to column nodes N0–N3 and N252–N255, respectively. The second group includes those columns bearing column addresses 8–15, where the columns bearing column addresses 8–11 and 12–15 are coupled to column nodes N4–N7 and N248–N251, respectively. Thus, the last group includes those columns bearing column addresses 248–255, where the columns bearing column addresses 248–251 and 252–255 are coupled to column nodes N124–N127 and N128–N131, respectively. A mapping of column nodes to column addresses for groups 1–9 is provided below in Table 1.

below, the column address assignments of each group may, in other embodiments, be modified to allow for data to be simultaneously written to memory cells in a greater or fewer number of the columns C.

The resistance of the write data line WD between adjacent columns of the array 40 is substantially equal and is given by $R_c$. Thus, the resistance of the write data line WD between the write driver 34 and column node Nn is equal to $(n+1)R_c$. For instance, the resistance of the write data line WD between the write driver 34 and column node N0 is equal to $R_c$, the resistance of the write data line WD between the write driver 34 and column node N1 is equal to $2R_c$, and the resistance of the write data line WD between the write driver 34 and column node N255 is equal to $256R_c$. The attenuation of a signal generated by the write driver 34 when writing data to a memory cell within a column at column node Nn is equal to $(n+1)IR_c$, where I is the current required to write data to a memory cell of the array 40. Thus, the attenuation of a signal generated by the driver 34 when simultaneously writing data to memory cells within eight

TABLE 1

| GROUP | COL ADDR | COL NODE | GROUP | COL ADDR | COL NODE | GROUP | COL ADDR | COL NODE |
|---|---|---|---|---|---|---|---|---|
| 1 | 0 | 0 | 4 | 12 | 12 | 7 | 36 | 24 |
|   | 1 | 1 |   | 13 | 13 |   | 37 | 25 |
|   | 2 | 2 |   | 14 | 14 |   | 38 | 26 |
|   | 3 | 3 |   | 15 | 15 |   | 39 | 27 |
|   | 4 | 252 |   | 16 | 238 |   | 40 | 226 |
|   | 5 | 253 |   | 17 | 239 |   | 41 | 227 |
|   | 6 | 254 |   | 18 | 240 |   | 42 | 228 |
|   | 7 | 255 |   | 19 | 241 |   | 43 | 229 |
| 2 | 8 | 4 | 5 | 20 | 16 | 8 | 44 | 28 |
|   | 9 | 5 |   | 21 | 17 |   | 45 | 29 |
|   | 10 | 6 |   | 22 | 18 |   | 46 | 30 |
|   | 11 | 7 |   | 23 | 19 |   | 47 | 31 |
|   | 12 | 248 |   | 24 | 234 |   | 48 | 222 |
|   | 13 | 249 |   | 25 | 235 |   | 49 | 223 |
|   | 14 | 250 |   | 26 | 236 |   | 50 | 224 |
|   | 15 | 251 |   | 27 | 237 |   | 51 | 225 |
| 3 | 16 | 8 | 6 | 28 | 20 | 9 | 52 | 32 |
|   | 17 | 9 |   | 29 | 21 |   | 53 | 33 |
|   | 18 | 10 |   | 30 | 22 |   | 54 | 34 |
|   | 19 | 11 |   | 31 | 23 |   | 55 | 35 |
|   | 20 | 242 |   | 32 | 230 |   | 56 | 218 |
|   | 21 | 245 |   | 33 | 231 |   | 57 | 219 |
|   | 22 | 246 |   | 34 | 232 |   | 58 | 220 |
|   | 23 | 247 |   | 35 | 233 |   | 59 | 221 |

Figure 2:
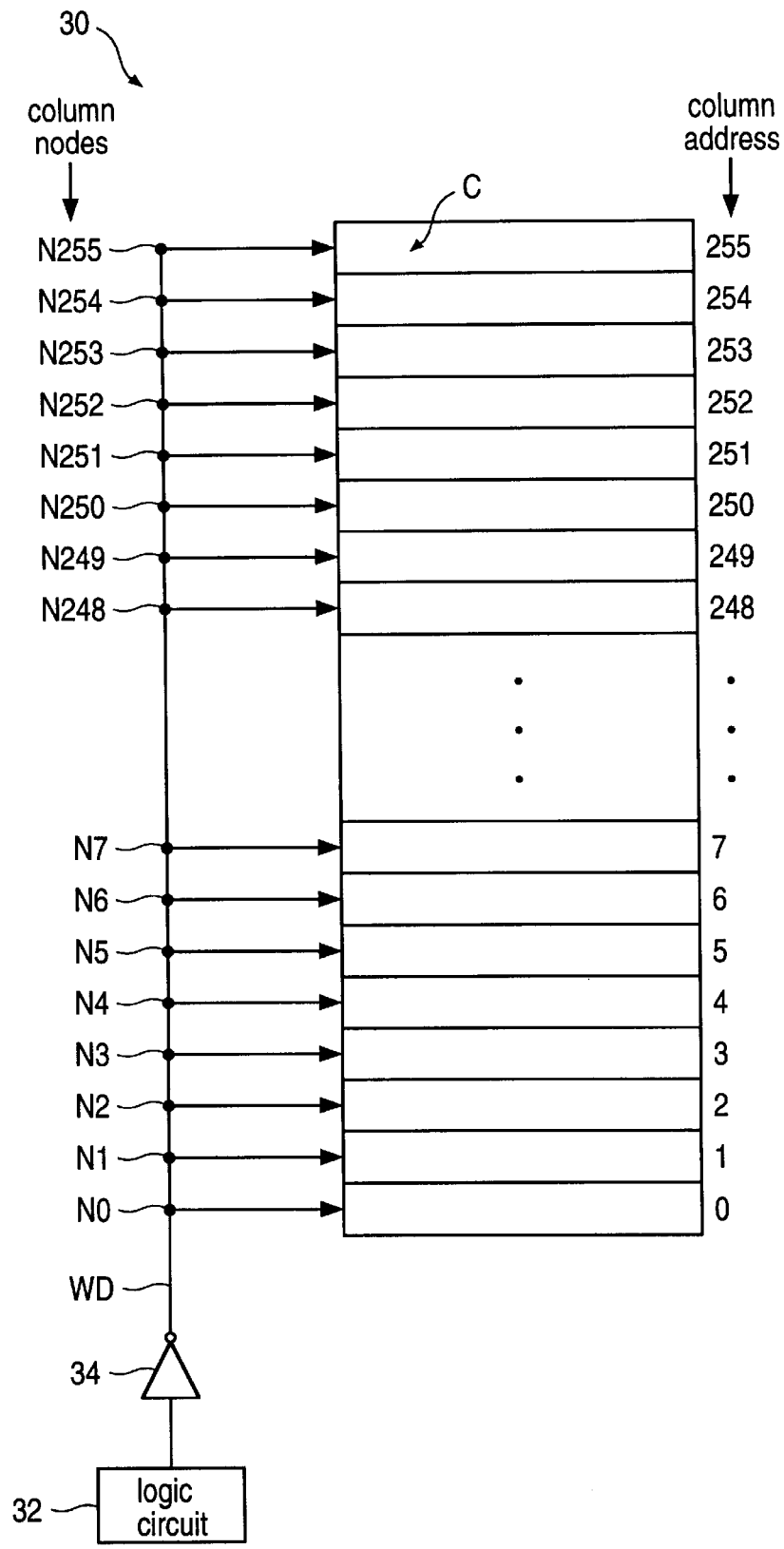
FIG. 2 is a block diagram of a conventional DRAM array having columns of the type illustrated in FIG. 1.

Thus, when accessing memory cells within the eight columns of any of the groups of columns C in the array 40, four of the addressed columns lie between the bottom point BP and the midpoint MP of the array 40, and four of the address columns lie between the midpoint MP and the top point TP of the array 40. Accordingly, when simultaneously writing data to the memory cells within the eight columns of a group, the average resistance of the write data line WD between each of the addressed columns and the write driver 34 is substantially the same, irrespective of which group of columns is selected for writing. Consequently, as explained in detail below, the attenuation of signals generated by the write driver 34 when simultaneously writing data to the memory cells in the eight columns of a group is substantially equal, irrespective of which group of columns is selected. As a result, signal attenuation during writing operations to the memory cells in multiple columns of the array 40 is significantly reduced, as compared to conventional addressing techniques such as, for instance, that employed in the array 30 (FIG. 2). As will be apparent after reading the discussion columns C of the array 40 is approximately equal to $8IR_{ave}$, where $R_{ave}$ is the average resistance of the write data line WD between the driver 34 and each of the eight selected columns.

For instance, the signal attenuation associated with simultaneously writing data to memory cells within the first group of columns, i.e., the columns bearing addresses 0–7 and corresponding to column nodes 0–3 and 252–255, is given by:

$$8IR_{ave} = 8I(R_0 + R_1 + R_2 + R_3 + R_{252} + R_{253} + R_{254} + R_{255})/8 =$$

$$\sum_{n=0}^{3} IR_n + \sum_{n=252}^{255} IR_n = \sum_{c=1}^{4} IR_c + \sum_{c=253}^{256} IR_c = 1028 IR_c.$$

The signal attenuation associated with simultaneously writing data to memory cells within the second group of columns, i.e., the columns bearing addresses 8–15 and corresponding to column nodes 4–7 and 248–251, is given by:

$$8IR_{ave} = 8I(R_4 + R_5 + R_6 + R_7 + R_{248} + R_{249} + R_{250} + R_{251})/8 =$$

$$\sum_{n=4}^{7} IR_n + \sum_{n=248}^{251} IR_n = \sum_{c=5}^{8} IR_c + \sum_{c=249}^{251} IR_c = 1028 IR_c.$$

Similarly, the signal attenuation associated with simultaneously writing data to memory cells within the sixty-fourth or last group of columns, i.e., the columns bearing addresses 248–255 and corresponding to column nodes 124–131, is given by:

$$8IR_{ave} = 8I(R_{124} + R_{125} + R_{126} + R_{127} + R_{128} + R_{129} + R_{130} + R_{131})/8 =$$

$$\sum_{n=124}^{131} IR_n = \sum_{c=125}^{132} IR_c = 1028 IR_c.$$

Thus, as shown above, the attenuation of signals generated by the write driver 34 to facilitate the simultaneous writing of data to the memory cells of eight consecutively addressed columns C of the array 40 is substantially constant, i.e., $1028 IR_c$, irrespective of which group of consecutively addressed columns is selected for writing. Therefore, in the present example, the write driver 34 of the array need only have a current-drive capability sufficient to compensate for a signal attenuation of approximately $1028 IR_c$ when simultaneously writing data to memory cells of eight columns. In contrast, arrays similar in size to the present array 40 and which employ conventional addressing techniques, such as the prior art array 30 shown in FIG. 2, must compensate for a signal attenuation approaching $16,160 IR_c$ when simultaneously writing to eight consecutively addressed columns.

In this manner, addressing techniques in accordance with the present invention allow for a significant reduction in control signal attenuation along the write data lines. Indeed, in the example illustrated above, present embodiments result in almost a 50% reduction in signal attenuation. This reduction in signal attenuation, in turn, allows for a corresponding reduction in the drive capability, and thus the size, of the write drivers which drive the write lines of an associated array. Thus, present embodiment not only conserve silicon die area, but also reduce power dissipation during such writing operations.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

I claim:

1. A memory array comprising:

a plurality of columns, each of said columns including a predetermined number of memory cells;

a write driver providing a signal which facilitates the writing of data to one or more of said memory cells; and a write data line coupled to said write driver, said write data line carrying said signal and having a plurality of column nodes thereon, each of said column nodes associated with and coupled to an associated one of said plurality of columns;

wherein a first group of said columns includes a predetermined number of said columns bearing first consecutive column addresses, a first portion of which being coupled to those column nodes closest to said write driver and a second portion of which being coupled to those column nodes furthest from said write driver;

wherein a second group of said columns includes a predetermined number of said columns bearing second consecutive column addresses, said second consecutive column addresses being sequential to said first consecutive column addresses, a first portion of which being coupled to those column nodes next closest to said write driver and a second portion of which being coupled to those column nodes next furthest from said write driver.

2. The array of claim 1, wherein said array comprises a DRAM array.

3. The array of claim 1, wherein each of said memory cells comprises a pass transistor and a storage capacitor.

* * * * *